May 2, 1950 M. E. AMES, JR 2,506,329

PHASE-SHIFT NETWORK AND OSCILLATOR

Filed Nov. 16, 1944 2 Sheets-Sheet 1

Inventor:-
Millard E. Ames Jr.
by his Attorneys
Howson & Howson

May 2, 1950 M. E. AMES, JR 2,506,329

PHASE-SHIFT NETWORK AND OSCILLATOR

Filed Nov. 16, 1944 2 Sheets-Sheet 2

Inventor:
Millard E. Ames Jr.
by his Attorneys
Howson & Howson

Patented May 2, 1950

2,506,329

UNITED STATES PATENT OFFICE 2,506,329

PHASE-SHIFT NETWORK AND OSCILLATOR

Millard E. Ames, Jr., Germantown, Pa., assignor to Philco Corporation, Philadelphia, Pa., a corporation of Pennsylvania Application November 16, 1944, Serial No. 563,699

7 Claims. (Cl. 250—36)

This invention relates to oscillation generators and particularly to those oscillation generators known in the art as phase-shift oscillators.

The theory and operation of the phase-shift oscillator have been described in several publications, for example, the "Proceedings of the I. R. E.," vol. 29, February, 1941, pages 43 to 49. Hence, it is deemed sufficient to relate here only the general construction and limitations of this type oscillator which obtain in present day practice.

The conventional phase-shift oscillator comprises a resistance-capacitance coupled vacuum tube amplifier circuit together with a phase shifting network connected between the output and input terminals of the amplifier. With sufficient gain in the amplifier circuit and a phase shift through the network, such that a certain minimum amount of the amplifier output voltage is applied to and in phase with the amplifier input voltage, self oscillation may be engendered in the amplifier circuit. The amplifier tube then serves as the oscillator tube of the system.

A filter network comprising either series resistors and shunt capacitors or series capacitors and shunt resistors is usually employed in a phase-shift oscillator to produce the required phase shift between the output and input of the oscillator tube. For practical reasons this phase shifting network usually contains at least three meshes.

In regard to the limitations which have heretofore placed certain restrictions upon the utility of the phase-shift oscillator, the first to be considered is that of the maximum frequency obtainable. The use of physical resistors and capacitors for the network elements, and in addition the deleterious effects upon the phase shifting property of the network produced by the distributed capacities of these elements as well as the distributed capacities which inadvertently occur at the output and input terminals of the oscillator tube, have more or less limited the phase-shift oscillator to the generation of oscillations whose frequencies lie within the audio frequency range or in the lower portion of the radio frequency range.

Another limitation is the restricted frequency range of the variable frequency phase-shift oscillator. Variable frequency operation is generally accomplished by varying the value of the resistive or capacitive elements (or both) of the network, the maximum frequency shift being obtained when all of the resistive or capacitive elements are varied simultaneously and uniformly. However, due to the complications involved in adjusting all resistances or condensers simultaneously from a common control, usually one or more of the units in the element group being varied are of fixed value. This results in a substantial reduction in frequency variation over that which would be obtained if all units of the element group were variable. It should also be noted that with simultaneous variation of all the resistors or capacitors in the network, the required amplification to sustain oscillations is independent of the frequency, whereas with one or more of the units of the variable element group of fixed value, the required amplification varies with changes in oscillator frequency.

It is known in the art to provide electronic means for varying the frequency of the phase shift oscillator, wherein a vacuum tube is included as a part of the phase shifting network, said tube being in series with or in shunt with a resistance element to alter the effective impedance of that element. However, the physical elements in the network have subjected the electronically-controlled variable frequency oscillator of present practice to the above limitations.

In order to extend the usefulness of the phase-shift oscillator, the present invention provides an oscillator of novel design wherein the output impedances of vacuum tubes, arranged in cathode follower type circuits, replace the usual resistances of the phase shifting network, and such small capacities as the distributed capacities to ground of the cathodes of these tubes may serve as the capacitive elements of the network. Substantial decrease in the values of the network elements greatly increases the maximum frequency obtainable, while a simple means for varying the impedance of all tubes uniformly permits a very wide frequency range.

It is, therefore, an object of the present invention to provide a phase-shift oscillator capable of generating high frequency oscillations.

Another object of the invention is to provide a variable frequency phase-shift oscillator having a greater maximum-to-minimum frequency ratio than that obtainable with conventional phase-shift oscillators.

Another object of this invention is to provide a phase-shift oscillator, the frequency of which may be varied manually or electronically over a wide range of frequencies.

A further object of the invention is to provide a novel phase shifting or delay network.

A still further object of the invention is to provide a phase shifting network which permits simultaneous and uniform variation of all of the resistive components of the network by relatively simple means.

Another object of the invention is to provide a phase-shift oscillator wherein each mesh of the phase shifting network is electrically isolated.

Another object of the invention is to provide a novel wide range sweep frequency generator.

It is also an object of the invention to provide a novel tuned radio frequency amplifier.

Other objects and advantages of this invention will become apparent from the following description in conjunction with the accompanying drawings, in which.

Figure 1:
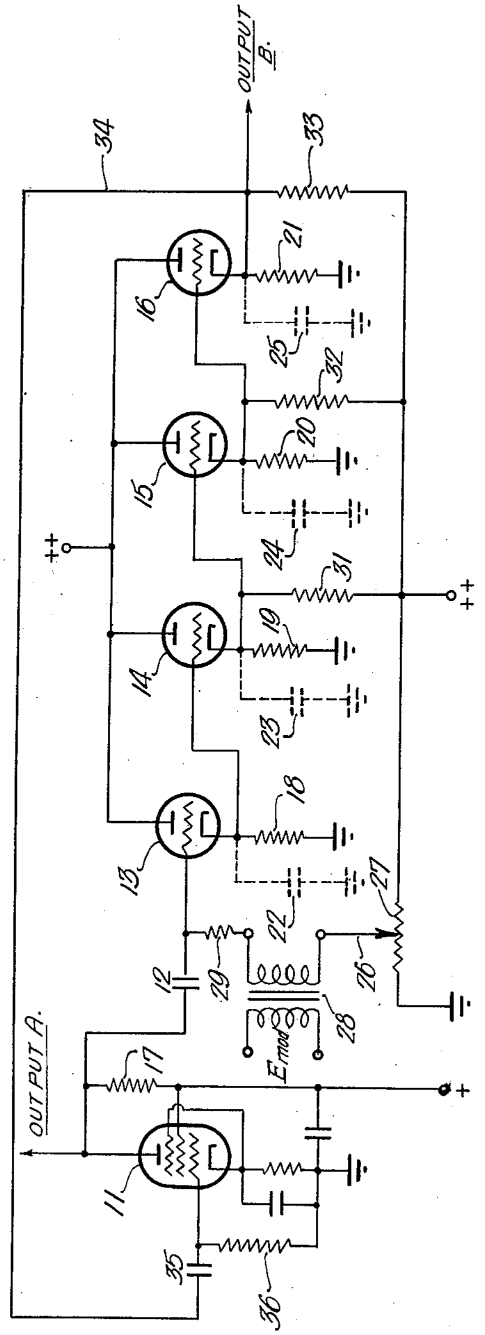
Fig. 1 is a circuit diagram of one embodiment of this invention.

In Fig. 1, the vacuum tube 11, which may be a pentode as shown, is arranged as a conventional self-biased resistance-capacitance coupled amplifier, and constitutes the usual oscillator tube of a phase-shift oscillator. The output of tube 11 is applied by way of a coupling condenser 12 to the control grid of the input tube 13 of the novel phase shifting network of this invention. This network, in accordance with the embodiment shown in Fig. 1, comprises the four vacuum tubes 13, 14, 15 and 16, preferably triodes, each of which is arranged in a cathode follower type amplifier circuit and directly coupled to the grid of the following tube. Operating potential for the phase shifting network is derived from a suitable source indicated in the drawing as ++, while the operating potential for the anode of oscillator tube 11 is derived from a source +, usually of lower potential than that of source ++ and applied by way of plate load resistor 17. Resistors 18, 19, 20 and 21 in the cathode circuits of their respective tubes are for the purpose of providing the direct current path in the cathode circuit of each network tube.

The actual load impedance for each cathode follower tube in the phase shifting network is the reactance of the capacity existing between the cathode of the tube and ground. In order to illustrate and describe a phase-shift oscillator whose maximum frequency of oscillation is limited only by the distributed capacities of the tubes employed and the minimum amount of amplification required, the capacity shown in the load circuit of each of the cathode follower tubes 13, 14, 15 and 16 of Fig. 1 is the distributed capacity to ground of the cathode of each tube. In the drawing, this distributed capacity for each of the cathode follower tubes is represented by the dotted line condensers 22, 23, 24 and 25 respectively. It is, of course, understood that physical condensers may be connected between the cathode and ground of each cathode follower tube when it is desired to operate the wide range phase-shift oscillator of this invention at lower normal frequencies.

It is evident that the impedance of the resistors 18, 19, 20 and 21 should be high in comparison to the reactance of the capacitors 22, 23, 24 and 25 at the operating frequency or frequencies of the oscillator. Suitable chokes having this comparatively high impedance at the operating frequencies may be used in place of the resistors.

Bias potential for the control grid of tube 13 may be obtained from any convenient source and preferably should be adjustable to provide for frequency control of the oscillator. In Fig. 1 this bias is obtained from the movable arm 26 of a potentiometer 27 connected across the anode voltage supply ++. The bias voltage is applied by way of a modulating voltage source, if one is employed, such as the secondary winding of modulating voltage coupling transformer 28, in series with the usual grid resistor 29. The remaining network tubes 14, 15 and 16 are preferably cathode biased. This may be readily accomplished by connecting a resistor between the anode voltage source ++ and the cathode of each of these tubes. This resistor for each of the tubes 14, 15 and 16 is shown at 31, 32 and 33 respectively. For correct bias potential, the value of these resistors should be such that the cathode potential of each tube differs from the cathode potential of the preceding tube by the amount of the desired bias. The output voltage of the phase shifting network is obtained from the cathode of the final cathode follower tube 16 and is applied by way of conductor 34 and capacitor 35 to the grid of oscillator tube 11 across the grid resistor 36. The output of the phase-shift oscillator may be obtained either from the anode of the oscillator tube 11 or from the cathode of the final tube 16 of the phase shifting network, depending upon the desired output voltage wave form. In the drawing the two output connections are indicated as "output A" and "output B," respectively. For example, operation of the oscillator tube 11 on the linear portion of its characteristic curve will give practically pure fundamental voltage output at the cathode of tube 16, whereas a small amount of harmonic voltages may be derived from the anode of tube 11. If desired, stronger harmonic output may be obtained by operating on the non-linear part of the characteristic curve of the oscillator tube 11. It is of course understood, although not shown in the drawing, that any well known means, such as an automatic volume control system may be employed with the phase-shift oscillator of this invention for maintaining linear operation, or for limiting the degree of non-linear operation of the oscillator tube 11.

Figure 3:
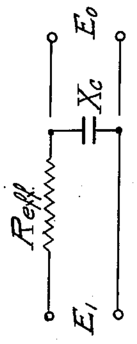
Fig. 3 is an equivalent circuit diagram applicable to a part of the circuit of Fig. 1.

The production of a phase shift between the voltage applied to the grid and the voltage developed at the cathode of each cathode follower stage of Fig. 1 may be better understood by referring to Fig. 3 in which there is shown an equivalent circuit diagram applicable to each of the cathode follower stages. Since the amplification factor of a cathode follower tube, with respect to its input voltage, is practically unity, the voltage $E_1$ in Fig. 3 may be considered as the input voltage to the tube. The impedance $R_{eff}$ represents the tube's effective series impedance which, for a vacuum tube in a cathode follower circuit, is of relatively low value. The load impedance $X_c$ is the reactance of the capacity between the cathode of each cathode follower tube and ground. The voltage $E_0$ represents the output voltage developed across the load impedance $X_c$. This voltage $E_0$ is applied to the input of the follower vacuum tube. The phase of the output voltage $E_0$ of each cathode follower stage will be shifted with respect to the input $E_1$ to that stage by an amount depending upon the ratio of the effective series impedance $R_{eff}$ of the tube to the reactance of the load impedance $X_c$. The arrangement of the four cathode follower stages of Fig. 1 is then in effect a four mesh phase shifting network of series resistances and shunt capacitors with each mesh electrically isolated by an amplifier having a gain of unity. A phase shift of 45° in each of the four cathode follower amplifier circuits of Fig. 1 would produce the required phase shift between the output and input of the oscillator tube 11. This 45° phase shift per stage will occur when the oscillation frequency is such that the reactance of the distributed capacity of the cathode of each cathode coupled tube is equal to the effective series impedance of the tube. Variation of this series impedance will change the frequency of oscillation necessary to produce the required phase shift in each cathode follower stage. Since the impedance of a vacuum tube is a function of the direct current passing through the tube, variable frequency operation of the phase-shift oscillator of Fig. 1 may be obtained by adjusting the average bias potential on the grids of the cathode follower tubes. And since the effective amplification factor of a cathode follower tube is practically unity a change in the bias potential on the grid of tube 13 will result in a similar bias potential change on the grids of the other network tubes. Hence the effective series impedance of the four network tubes may be changed simultaneously and uniformly by varying the bias of the grid of tube 13, thereby providing a high maximum-to-minimum frequency ratio and a constant required amplification in the oscillator circuit of tube 11. The adjustment of the bias of input tube 13 may be accomplished manually by changing the position of the movable arm 26 of potentiometer 27, or electronically by the application of a modulating voltage to the primary winding of the modulation transformer 28 as indicated by the voltage $E_{mod}$. It is, of course, understood that any of the other well known means of applying an external control voltage to change the bias potential of the grid of tube 13 may be employed in place of the modulating transformer 28.

In practice, the frequency of a modulating voltage employed to frequency modulate the oscillator is usually much lower than the oscillator frequency. It is, therefore, preferable that the values of the grid coupling condenser 35 and the grid resistor 36 of oscillator tube 11 be so chosen that the effect of the modulating voltage upon the grid of this tube is minimized.

Figure 2:
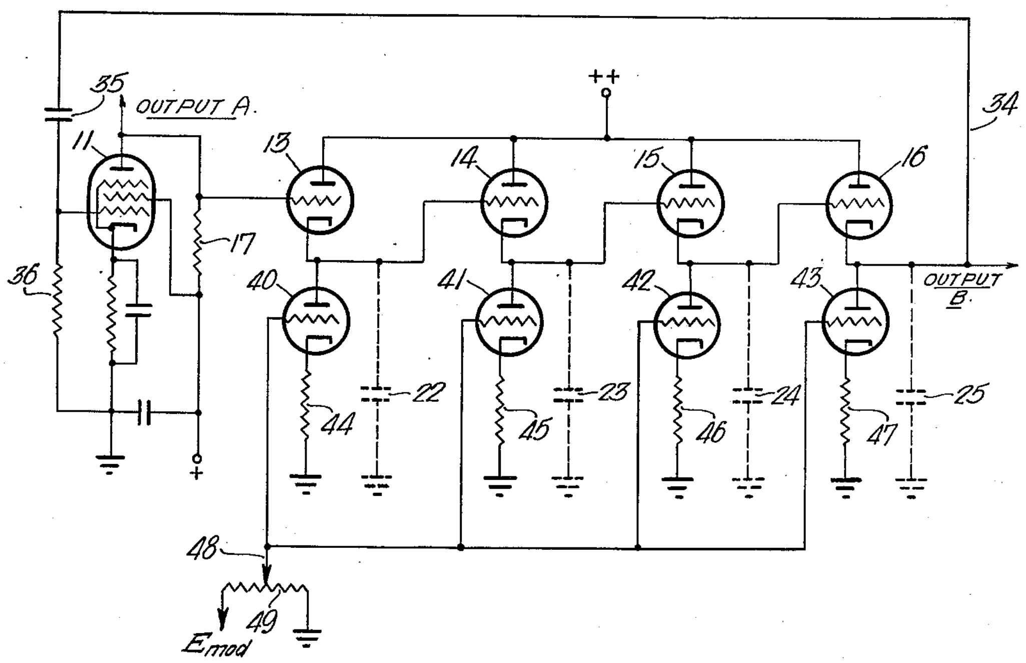
Fig. 2 is a similar diagram of another form of the invention.

In Fig. 2 there is shown another form of the present invention which differs primarily from the embodiment just described in the manner of coupling the oscillator tube to the phase shifting network and in the method of varying the effective series impedance of the cathode follower tubes of the network. An increased maximum-to-minimum frequency ratio, and a reduction in the amount of modulating frequency voltage appearing at the grid of the oscillator tube, may be obtained by means of the circuit of Fig. 2. The components of the phase-shift oscillator illustrated in Fig. 2 which are similar to those in Fig. 1 bear the same reference characters.

The embodiment of the invention in accordance with Fig. 2 permits direct coupling between the output of the oscillator tube 11 and the grid of the first cathode follower tube 13. The omission of the usual series coupling condenser between these two points in the circuit eliminates the possibility of phase shift and consequent oscillation at low frequencies. By using a large capacitor for the remaining coupling condenser 35, degeneration will take place at all frequencies lower than that of correct oscillation. These frequencies include power supply ripple frequency, microphone tube noises, and the modulating frequency.

In the phase-shift oscillator circuit of Fig. 2, the direct current path for the cathode circuit of each cathode follower tube 13, 14, 15 and 16 includes a variable impedance in the form of a vacuum tube having at least a cathode, a control grid and an anode. The potential applied to the grid of this latter tube may then be used to control the amount of direct current flowing through the cathode follower tube and hence the effective series impedance thereof. In the illustration the tubes 40, 41, 42 and 43, which may be referred to as control tubes, provide the variable impedance path in the direct current circuit of the cathode of each of the cathode follower tubes 13, 14, 15 and 16 respectively. For the reasons previously stated, the plate resistance of each control tube should be high in comparison to the reactance of the capacities represented by the dotted line condensers 22, 23, 24 and 25. Each cathode of the control tubes 40, 41, 42 and 43 may be grounded directly, or through a resistance as shown in the drawing by the resistors 44, 45, 46 and 47. These resistors help to increase the plate resistance of the control tubes and also tend to give a more linear control of the direct current through the tubes. To provide simultaneous and uniform adjustment of the effective series impedance of the cathode follower tubes, the control grids of the four control tubes 40, 41, 42 and 43 are jointly connected to a common biasing potential source. In Fig. 2 the bias is obtained from the movable arm 48 of the potentiometer 49. This potentiometer may be connected across a modulating voltage source as indicated in the drawing, or if desired, to some source of fixed potential. In the latter arrangement of the potentiometer 49, the movable arm 48 provides a means of frequency control, whereas a varying potential applied to the $E_{mod}$ terminal of the potentiometer will frequency modulate the ouput of the phase-shift oscillator, the amount of frequency sweep being regulated by the movable arm 48. With an alternating modulation voltage applied to the $E_{mod}$ terminal of potentiometer 49, a particular desired mean frequency, within the range of the oscillator, may be obtained by any convenient and well known method of adjusting the direct current through each cathode follower tube to a value which results in the required effective series impedance for this frequency.

The output voltage of the phase shifting network, and also the output of the phase-shift oscillator, illustrated in Fig. 2 may be obtained at the same points in the system as described for the embodiment of Fig. 1.

Figure 4:
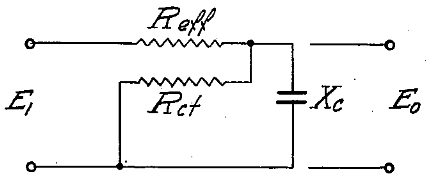
Fig. 4 is an equivalent circuit diagram for a portion of the circuit of Fig. 2.

In Fig. 4 there is shown an equivalent circuit diagram for each cathode follower stage of the phase shifting network employed in the phase-shift oscillator illustrated in Fig. 2. Referring to Fig. 4, the symbols $E_1$, $R_{eff}$, $X_c$ and $E_0$ correspond to the like symbols described in connection with the equivalent circuit of Fig. 3. Since the effective series impedance $R_{eff}$ of the cathode follower tube is a function of the plate resistance of the control tube, an additional element $R_{ct}$ is included in Fig. 4 to represent this plate resistance and to show its relation to the other elements in the equivalent circuit diagram. This resistance $R_{ct}$ will be of much higher value than the effective impedance $R_{eff}$ and the reactance $X_c$, and therefore it will have little effect upon the phase shift. However, for the purpose of calculating the phase shift, resistance $R_{ct}$ may be considered as being in parallel with the impedance $R_{eff}$. The resistance $R_{ct}$ will vary in proportion to the impedance $R_{eff}$ and, unlike the fixed cathode resistors of Fig. 1, will not affect the operation of the circuit. Consequently, a greater frequency range is obtained in the embodiment of Fig. 2.

In practice, the modulating voltage applied to the grids of the control tubes 40, 41, 42 and 43 of Fig. 2 to produce a given frequency swing will not be as great as the modulating voltage required for the circuit of Fig. 1. In Fig. 1 this modulating voltage will appear at the output of the phase-shift network and will be approximately equal to the modulating voltage applied to the grid of the first network tube. In the circuit of Fig. 2, the modulating voltage appearing at the output of the phase shifting network will be approximately equal to $N \cdot E_{mod}$, where N is the number of stages. In practice, the circuit of Fig. 2 is more desirable since the modulating voltage required is usually less than 1/N times the modulating voltage that would be required for the system of Fig. 1.

Although there is illustrated and described for both embodiments of the present invention a phase shifting network comprising four cathode follower amplifier stages, it is to be understood that the number of stages in the network is limited only by practical considerations.

Many additional applications of the phase shifting network provided by the present invention will become apparent to those familiar with the art. For example, a phase shifting network similar to either of those described may be used in conjunction with a non-oscillating amplifier tube to function as a tuned radio frequency amplifier. By properly adjusting the bias controls of the phase shifting network, incoming signals of the desired frequency applied to the grid of the amplifier tube would produce a regenerative action through the amplifier circuit while signals of undesired frequencies would suffer degeneration.

By way of example, a phase-shift oscillator constructed in accordance with the circuit of Fig. 1, employing a type 6AC7 pentode for the oscillator tube 11 and two type 6SN7 twin triodes for the four cathode follower amplifier tubes 13, 14, 15 and 16, generated oscillations the frequency of which was varied from 2.4 megacycles to 12.5 megacycles by adjustment of the bias on the control grids of the amplifier tubes. Some of the circuit constants for this particular oscillator are given below:

Capacitor 12—5000 $\mu\mu$f
Capacitor 35—500 $\mu\mu$f
Capacitors 22, 23, 24 and 25—Distributed capacities of approx. 20 $\mu\mu$f each
Resistors 18, 19, 20 and 21—40,000 ohms each
Resistor 29—200,000 ohms
Resistor 31—720,000 ohms
Resistor 32—340,000 ohms
Resistor 33—213,000 ohms One practical embodiment of the present invention in accordance with the circuit of Fig. 2 also employed a type 6AC7 pentode for the oscillator tube 11. One triode section of a type 6SN7 twin triode was used for each cathode follower amplifier tube, while the other triode section served as the control tube for its associated cathode follower tube. With a potential of 200 volts on the anode of the cathode follower tubes, the value of each resistor 44, 45, 46, and 47 was 5000 ohms. The coupling condenser 35 had a capacity of 0.5 microfarad. With the distributed capacity to ground of the cathode of each cathode follower tube serving as the condensers 22, 23, 24 and 25, frequencies as high as 15 megacycles were generated. Variation in the bias on the grids of the control tubes gave a frequency range of approximately twenty-five to one. By employing a 0.05 microfarad capacitor for each condenser shown at 22, 23, 24 and 25 in Fig. 2, oscillations whose frequencies were variable from 2 kilocycles to 200 kilocycles were produced.

Although the present invention has been disclosed with reference to two of the preferred forms, it will be understood that the invention is capable of various modifications and is to be limited only by the scope of the appended claims.

I claim:

1. A phase shift oscillator comprising, in combination, a vacuum tube having at least a grid circuit and an anode circuit, a phase shift network comprising a plurality of cathode follower stages connected in cascade, each of said stages including a vacuum tube having at least cathode, grid and anode electrodes, the tube of each stage except the last having its cathode connected to the grid of the next succeeding tube, and means including said network for coupling the anode circuit of said first-named vacuum tube to the grid circuit thereof.

2. A phase shift oscillator comprising, in combination, a vacuum tube having at least a grid circuit and an anode circuit, a phase shift network comprising a plurality of cathode follower stages connected in cascade, each of said stages including a vacuum tube having at least cathode, grid and anode electrodes, the tube of each stage except the last having its cathode connected to the grid of the next succeeding tube, whereby the vacuum tubes of said stages constitute series resistance elements of said network, there being a reactance between each said cathode and ground constituting a shunt element of said network, and means including said network for coupling the anode circuit of said first-named vacuum tube to the grid circuit thereof.

3. A phase shift oscillator according to claim 2, wherein said reactance is a capacitance.

4. A phase shift oscillator according to claim 1, including means for applying a variable potential to the grid of the first cathode follower tube, thereby to vary the operating frequency of the oscillator.

5. A phase shift oscillator according to claim 1, including a variable impedance in the cathode circuit of each cathode follower tube, and means for varying at least one of said impedances, thereby to vary the operating frequency of the oscillator.

6. A phase shift oscillator according to claim 1, including a vacuum tube connected in the cathode circuit of each cathode follower tube, each of the last-recited tubes having a control grid, and means for applying a variable potential to the grid of at least one of the last-recited tubes, thereby to vary the operating frequency of the oscillator.

7. A multi-section electrical network, comprising a plurality of cathode follower stages connected in cascade, each of said stages including a vacuum tube having at least triode elements and a reactive load connected at one end to the cathode of said tube, each load including the anode-cathode path of a vacuum tube having at least triode elements, the input to each of said stages being applied between the grid of said tube and the other end of said load, and the output of each of said stages being derived from said reactive load.

MILLARD E. AMES, Jr.

REFERENCES CITED

The following references are of record in the file of this patent:

UNITED STATES PATENTS

| Number | Name | Date |
|---|---|---|
| 1,943,986 | Nyman | Jan. 16, 1934 |
| 2,149,361 | Rath | Mar. 7, 1939 |
| 2,236,985 | Bartelink | Apr. 1, 1941 |
| 2,300,632 | Poch | Nov. 3, 1942 |
| 2,321,269 | Artzt | June 8, 1943 |
| 2,386,892 | Hadfield | Oct. 16, 1945 |
| 2,429,755 | Hallmark | Oct. 28, 1947 |
| 2,433,378 | Levy | Dec. 30, 1947 |
| 2,452,586 | McCoy | Nov. 2, 1948 |